US007674570B2

(12) United States Patent
Nagahama et al.

(10) Patent No.: US 7,674,570 B2
(45) Date of Patent: Mar. 9, 2010

(54) MASK PATTERN INSPECTION METHOD, EXPOSURE CONDITION VERIFICATION METHOD, AND MANUFACTURING METHOD OF SEMICONDUCTOR DEVICE

(75) Inventors: Ichirota Nagahama, Koga (JP); Yuichiro Yamazaki, Tokyo (JP); Atsushi Onishi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 827 days.

(21) Appl. No.: 11/480,382

(22) Filed: Jul. 5, 2006

(65) Prior Publication Data
US 2007/0009811 A1   Jan. 11, 2007

(30) Foreign Application Priority Data
Jul. 6, 2005   (JP)   ............................. 2005-197522

(51) Int. Cl.
*G03F 7/20* (2006.01)
(52) U.S. Cl. ............................. 430/296; 430/30; 430/5; 430/311; 382/144
(58) Field of Classification Search .................... 430/5, 430/30, 296, 311; 250/310; 356/237.1, 237.4; 382/144
See application file for complete search history.

(56) References Cited
U.S. PATENT DOCUMENTS

| | | | | | |
|---|---|---|---|---|---|
| 4,958,074 | A | * | 9/1990 | Wolf et al. ................... | 250/309 |
| 6,156,461 | A | * | 12/2000 | Grenon et al. ................. | 430/5 |
| 6,760,101 | B2 | * | 7/2004 | Sato et al. .................. | 356/237.4 |
| 7,123,356 | B1 | * | 10/2006 | Stokowski et al. ........ | 356/237.2 |
| 2002/0028399 | A1 | * | 3/2002 | Nakasuji et al. ............... | 430/30 |
| 2004/0018436 | A1 | * | 1/2004 | Ishikawa ........................ | 430/5 |
| 2004/0047982 | A1 | * | 3/2004 | Takagi ........................ | 427/100 |
| 2005/0029451 | A1 | * | 2/2005 | Nagahama et al. .......... | 250/310 |
| 2005/0090120 | A1 | * | 4/2005 | Hasegawa et al. ........... | 438/738 |

FOREIGN PATENT DOCUMENTS

CN   1488191 A   4/2004

OTHER PUBLICATIONS

Notification of the First Office Action issued by the Chinese Patent Office on Apr. 3, 2009, for Chinese Patent Application No. 200610100292.1, and English-language translation thereof.

* cited by examiner

*Primary Examiner*—Mark F Huff
*Assistant Examiner*—Stewart A Fraser
(74) *Attorney, Agent, or Firm*—Finnegan, Henderson, Farabow, Garrett & Dunner, L.L.P.

(57) ABSTRACT

A mask pattern inspection method includes: transferring a mask pattern onto a conductor substrate or a semiconductor substrate; preparing a sample including a substrate surface pattern in an electrically conductive state to the substrate, the substrate surface pattern being constituted of a convex pattern or a concave pattern each having a shape in accordance with the transferred mask pattern, or a surface layer obtained by filling the concave pattern with a material; irradiating the sample with an electron beam to detect at least one of a secondary electron, a reflected electron and a backscattered electron generated from the surface of the sample, thereby acquiring an image of the sample surface; and inspecting the mask pattern on the basis of the image.

12 Claims, 9 Drawing Sheets

THERMAL OXIDATION

APPLY RESIST MATERIAL TO
ANTI-REFLECTION COATING

EXPOSURE

SiO$_2$ RIE

REMOVE RESIST /
ANTI-REFLECTION COATING

APPLY RESIST MATERIAL TO ANTI-REFLECTION COATING

EXPOSURE

Si RIE

REMOVE RESIST / ANTI-REFLECTION COATING

LP CVD

CMP

MASK PATTERN INSPECTION METHOD, EXPOSURE CONDITION VERIFICATION METHOD, AND MANUFACTURING METHOD OF SEMICONDUCTOR DEVICE

CROSS REFERENCE TO RELATED APPLICATION

This application claims benefit of priority under 35 USC §119 to Japanese patent application No. 2005-197522, filed on Jul. 6, 2005, the contents of which are incorporated by reference herein.

BACKGROUND OF THE INVENTION

1. Field of the Invention

The present invention relates to a mask pattern inspection method, an exposure condition verification method, and a manufacturing method of a semiconductor device.

2. Related Background Art

In inspection of a photo mask substrate, there is a defect which cannot be detected by a mask inspection unit. This defect inspection includes, for example, the inspection of a phase shifter defect, the inspection of a transmittance defect and the inspection of an optimum degree of an OPC shape of a photo mask. As to such inspection, instead of directly inspecting a mask pattern, a method is adopted which uses an optically developed image or a secondary electronic image obtained by once transferring the mask pattern onto a resist on a wafer through exposure and by irradiating this transferred pattern with light or an electron beam. In recent years, as a design rule becomes minute, there especially increases the need of inspection by the electron beam which is advantageous for high-resolution inspection.

However, the resist pattern inspection by the electron beam has a problem that detection sensitivity remarkably deteriorates because of strain or contrast deficiency of a pattern image due to charging of the resist. Especially in inspection of a multilayered resist structure for etching with a high aspect ratio, the whole surface of a wafer is coated with a comparatively thick insulating film, and therefore, the problem becomes more serious.

SUMMARY OF THE INVENTION

According to a first aspect of the invention, there is provided a mask pattern inspection method comprising:

transferring a mask pattern onto a conductor substrate or a semiconductor substrate;

preparing a sample including a substrate surface pattern in an electrically conductive state to the substrate, the substrate surface pattern being constituted of a convex pattern or a concave pattern each having a shape in accordance with the transferred mask pattern, or a surface layer obtained by filling the concave pattern with a material;

irradiating the sample with an electron beam to detect at least one of a secondary electron, a reflected electron and a backscattered electron generated from the surface of the sample, thereby acquiring an image of the sample surface; and inspecting the mask pattern on the basis of the image.

According to a second aspect of the invention, there is provided an exposure condition verification method comprising:

transferring a mask pattern onto a conductor substrate or a semiconductor substrate;

preparing a sample including a substrate surface pattern in an electrically conductive state to the substrate, the substrate surface pattern being constituted of a convex pattern or a concave pattern each having a shape in accordance with the transferred mask pattern, or a surface layer obtained by filling the concave pattern with a material;

irradiating the sample with an electron beam to detect at least one of a secondary electron, a reflected electron and a backscattered electron generated from the surface of the sample, thereby acquiring an image of the sample surface;

inspecting the mask pattern based on the image; and verifying whether or not preset exposure conditions are appropriate concerning the mask pattern which has passed the inspection on the basis of the inspection result of the mask pattern.

According to a third aspect of the invention, there is provided a manufacturing method of a semiconductor device, comprising transferring a mask pattern inspected by a mask pattern inspection method onto a substrate to thereby manufacture the semiconductor device, the mask pattern inspection method including:

transferring a mask pattern onto a conductor substrate or a semiconductor substrate;

preparing a sample including a substrate surface pattern in an electrically conductive state to the substrate, the substrate surface pattern being constituted of a convex pattern or a concave pattern each having a shape in accordance with the transferred mask pattern, or a surface layer obtained by filling the concave pattern with a material;

irradiating the sample with an electron beam to detect at least one of a secondary electron, a reflected electron and a backscattered electron generated from the surface of the sample, thereby acquiring an image of the sample surface; and inspecting the mask pattern on the basis of the image.

According to a fourth aspect of the invention, there is provided a manufacturing method of a semiconductor device, comprising transferring a mask pattern onto a substrate using an exposure condition to thereby manufacture the semiconductor device, the exposure condition being verified by an exposure condition verification method including:

transferring a mask pattern onto a conductor substrate or a semiconductor substrate;

preparing a sample including a substrate surface pattern in an electrically conductive state to the substrate, the substrate surface pattern being constituted of a convex pattern or a concave pattern each having a shape in accordance with the transferred mask pattern, or a surface layer obtained by filling the concave pattern with a material;

irradiating the sample with an electron beam to detect at least one of a secondary electron, a reflected electron and a backscattered electron generated from the surface of the sample, thereby acquiring an image of the sample surface;

inspecting the mask pattern based on the image; and verifying whether or not preset exposure conditions are appropriate concerning the mask pattern which has passed the inspection on the basis of the inspection result of the mask pattern.

DETAILED DESCRIPTION OF THE INVENTION

Figure 1:
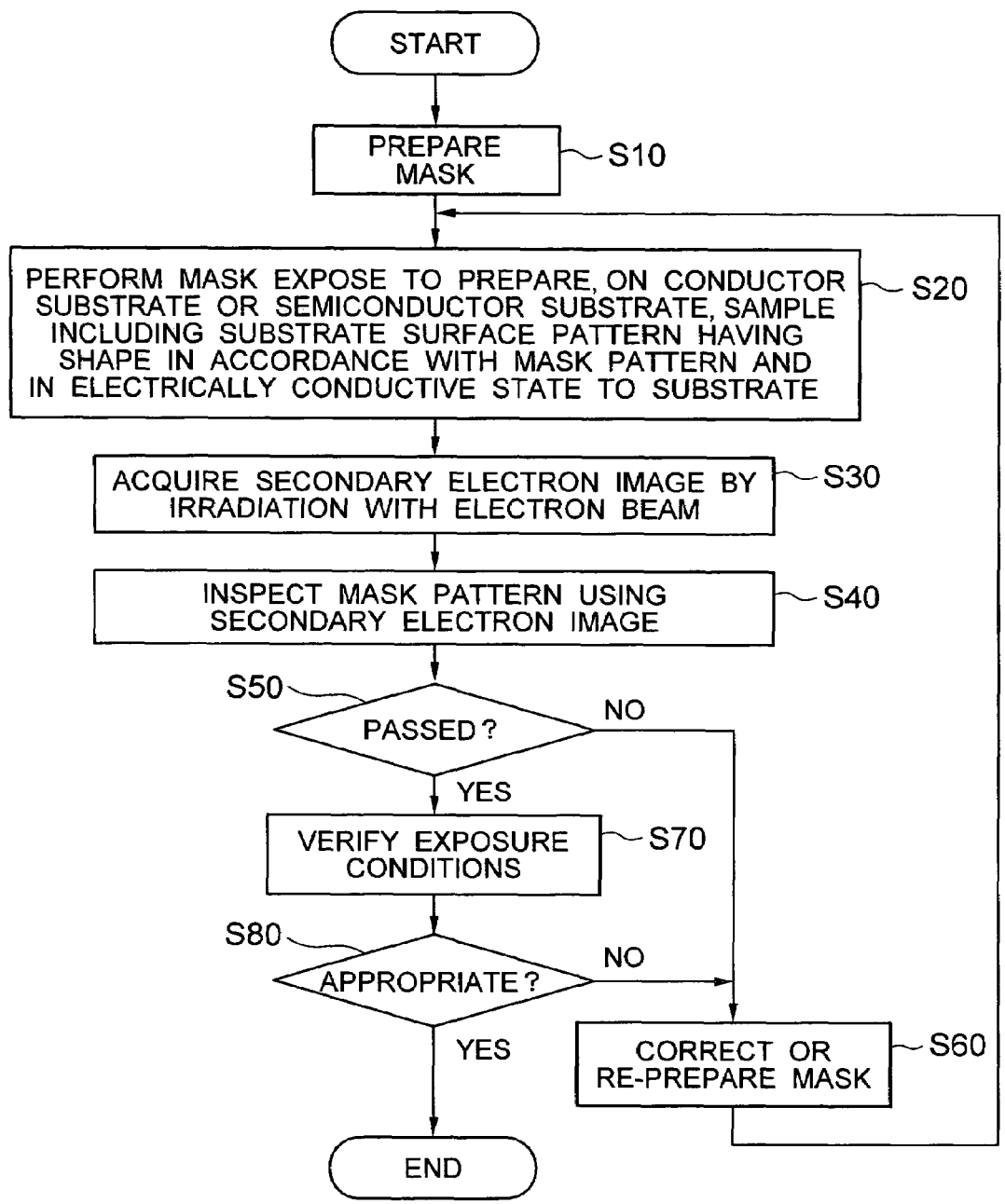
FIG. 1 is a flowchart showing a schematic procedure of a first embodiment of the present invention.

There will be described some embodiments of the present invention with reference to the drawings. It is to be noted that in the attached drawings, the same component is denoted with the same reference numeral, and redundant description thereof is omitted.

(1) FIRST EMBODIMENT

FIG. 1 is a flowchart showing a schematic procedure of a first embodiment of the present invention. The present embodiment has purposes of inspection of a finishing degree of a mask at a time when the mask is newly prepared and verifying inspection for optimization of exposure conditions. The inspection of the mask for the finishing degree includes physical defect inspection, phase shifter defect inspection, transmittance defect inspection and OPC verifying inspection.

First, a mask is newly prepared which is a final evaluation object (step S10). Next, mask exposure is performed to transfer a mask pattern onto a conductor substrate or a semiconductor substrate, whereby there is prepared a sample including a pattern (hereinafter referred to as the "substrate surface pattern") having a shape in accordance with the mask pattern and having an electrically conductive state to the substrate (step S20). This procedure shown in the step S20 is one of characteristic procedures in the present embodiment. A specific structure of the sample and a manufacturing method of the sample will be described later in detail.

Next, the prepared sample is set to an electron beam (EB) unit, and irradiated with an electron beam. From the surface of the sample, there are generated secondary electrons, reflected electrons and backscattered electrons (hereinafter referred to as the "secondary electrons and the like"), and these secondary electrons and the like are detected to acquire an image indicating a state of the surface of the sample (step S30). In a case of an electron optics system using EB projection optics, the secondary electrons and the like are enlarged and projected as secondary electron beams into an image on a detection surface of detecting means such as a micro channel plate (MCP) (not shown), and detected.

Subsequently, the mask pattern is inspected using the resultant image (step S40). In a case where an inspection result does not satisfy, for example, required specifications of a product, and the sample fails in the inspection (step S50), the result is fed back to mask design. If the result indicates a correctable slight defect, this defect is corrected. Alternatively, if the defect is a non-correctable serious defect, the mask is prepared again (step S60). The above procedures are repeated using the corrected or re-prepared mask until the mask passes the inspection (steps S20 to S50).

In a case where there are no defects in the mask pattern itself or the defect is eliminated by execution of the above procedures, the procedure shifts to verification to judge whether or not predetermined exposure conditions concerning the mask pattern are appropriate (step S70). In a case where it is judged that the exposure conditions are inappropriate, this mask is corrected, when the correction of the mask is effective. Alternatively, if the exposure conditions are inappropriate to such an extent that the correction of the mask is not effective, the mask is prepared again (step S60). The above procedures are repeated using the corrected or re-prepared mask until the appropriate exposure conditions are obtained (steps S20 to S80).

Figure 2:
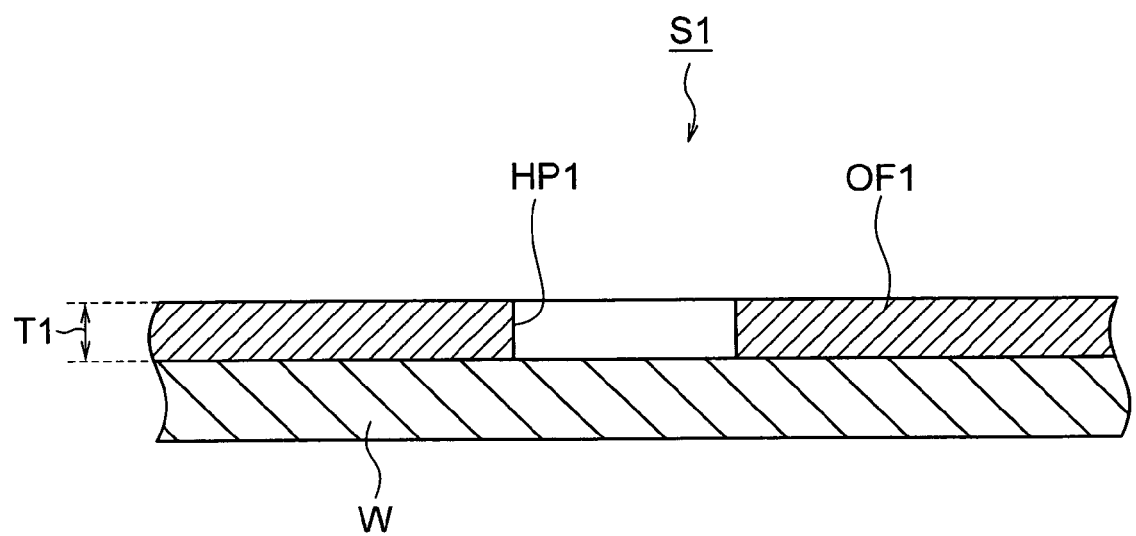
FIG. 2 is a sectional view showing one example of a sample for use in the first embodiment of the present invention.

One example of the sample formed in the step S20 of FIG. 1 is shown in a sectional view of FIG. 2. A sample S1 shown in FIG. 2 comprises a silicon substrate W, and a silicon oxide film OF1 which is an insulating film formed on the silicon substrate W. In the silicon oxide film OF1, there is formed a concave pattern HP1 having a shape in accordance with the mask pattern transferred by the mask exposure. The concave pattern HP1 of the present embodiment corresponds to, for example, the substrate surface pattern. Since the bottom of the concave pattern HP1 corresponds to an exposed top surface of the silicon substrate W, the concave pattern HP1 is brought into an electrically conductive state with respect to the silicon substrate W.

Figure 3A:
FIGS. 3A to 3F are sectional views showing a manufacturing method of the sample shown in FIG. 2.
Figure 3B:
Figure 3C:
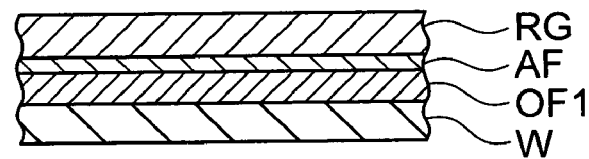
Figure 3D:
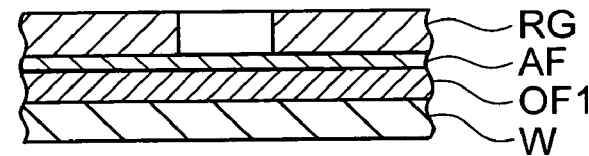
Figure 3E:
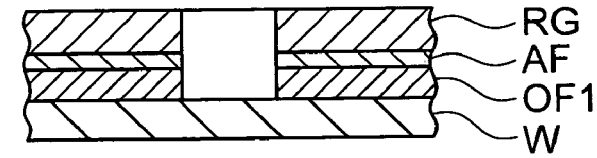
Figure 3F:
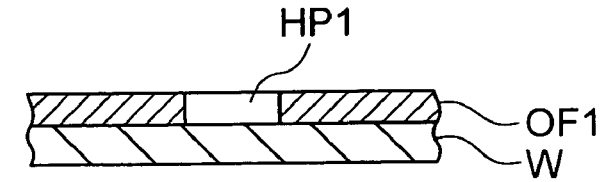

A manufacturing method of the sample S1 shown in FIG. 2 will be described with reference to sectional views of FIGS. 3A to 3F. First, the surface of the silicon substrate W shown in FIG. 3A is thermally oxidized, whereby the silicon oxide film OF1 is formed (FIG. 3B). Next, an anti-reflection coating AR is formed on the silicon oxide film OF1, and a resist material is applied to the top of the anti-reflection coating AR to form a resist film RG (FIG. 3C). Subsequently, the mask pattern of the photo mask is made thereon by exposure using an exposure apparatus (not shown) (FIG. 3D). Next, for example, by reactive ion etching (RIE), portions positioned under a portion of the resist film RG removed in accordance with the mask pattern are selectively removed from the anti-reflection coating AR and the silicon oxide film OF1 forming an underlayer of the resist film RG, whereby the mask pattern is transferred onto the silicon oxide film OF1 (FIG. 3E). Finally, for example, plasma ashing is performed to remove remaining portions of the anti-reflection coating AR and the resist film RG from the silicon oxide film OF1, whereby the sample S1 shown in FIG. 2 is prepared (FIG. 3F).

Here, it is preferable that a film thickness T1 of the silicon oxide film OF1 of the sample S1 is small for the following reasons.

1) Reduction of Incident Electron Energy:

To reduce a charge amount of the silicon oxide film OF1 due to the irradiation with the electron beam, the thickness T1 of the silicon oxide film OF1 is set to such a value that at least incident electrons can penetrate the film to reach the underlayer silicon substrate W. In a case where the incident electron energy is, for example, 1 keV, when the thickness T1 of the silicon oxide film OF1 is 40 nm or less, the incident electrons can penetrate the silicon oxide film OF1 to reach the underlayer silicon substrate W. Furthermore, when the silicon oxide film OF1 is formed into such thickness, the incident electron energy can accordingly be set to be low. Therefore, it is possible to use the EB unit having a simple constitution, and this can reduce cost required for the mask pattern inspection and the exposure condition verification.

2) Improvement of Pattern Transfer Property:

In a case where the resist pattern is transferred onto the silicon oxide film OF1 by the RIE, when the film thickness of the silicon oxide film OF1 is small, the shape of the resist pattern can faithfully be transferred onto the silicon oxide film OF1.

Figure 4:
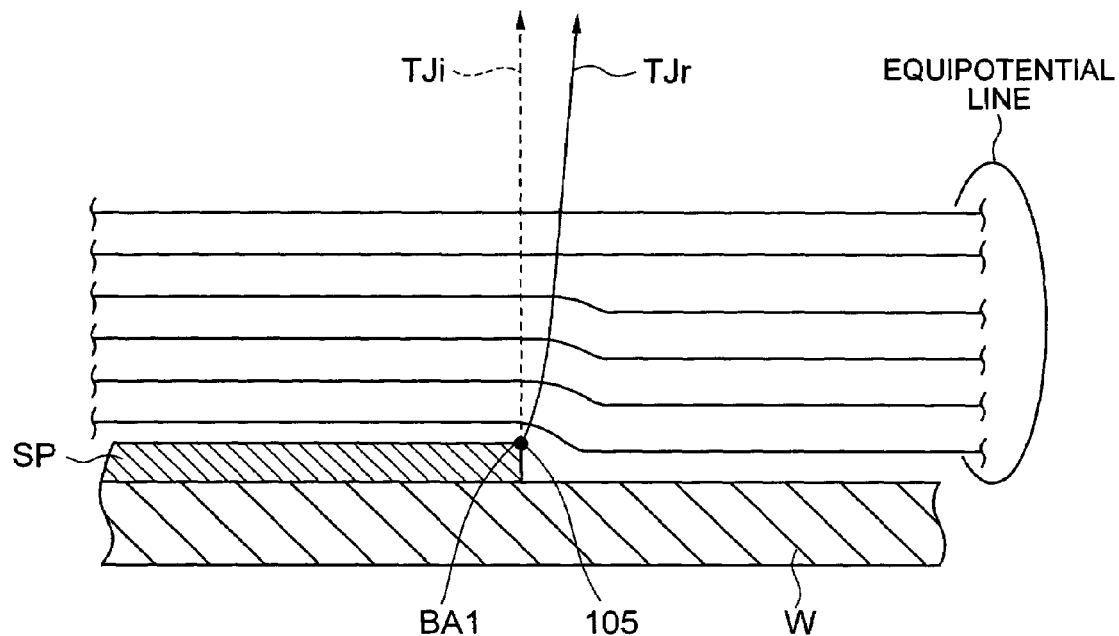
FIG. 4 is an explanatory view showing an influence on inspection or verification in a case where there is a stepped portion on the surface of the sample.

3) Improvement of Surface Potential Uniformity of Substrate W in an Electron Optics Inspection using EB Projection Optics:

In a case where the substrate surface is not flat and there is a stepped portion, a gradient is generated in a potential distribution in the vicinity of the substrate surface, and trajectories of the secondary electrons and the like generated from the substrate are largely influenced. Therefore, in a case of the electron optics inspection system using EB projection optics, image distortion and signal amount decrease are caused in the resultant image. This respect will more specifically be described with reference to FIG. 4. As shown in FIG. 4, in a case where, for example, a convex pattern SP is formed on the surface of the silicon substrate W, even if the whole substrate surface has a substantially equal potential, a potential gradient is generated in the vicinity of a boundary portion BA1 of the stepped portion, and a secondary electron beam emitted from, for example, an arbitrary point 105 on an edge of the boundary portion BA1 passes through a trajectory TJr which deviates from an ideal trajectory TJi. As a result, when the image is acquired with the electron optics inspection system using EB projection optics, there remarkably appear the image strain in the boundary portion BA1 and the decrease of the signal amount. To solve the problem the thickness of the silicon oxide film OF1 is reduced. Thus, the stepped portion is made low and the potential gradient becomes gradual. As a result, improvement of an inspection performance is realized in the EB inspection of the electron optics (inspection) system (using EB projection optics).

On the other hand, if the film thickness T1 of the silicon oxide film OF1 is excessively small, from a viewpoint of the emission of the secondary electrons, there is a problem that a contribution degree of underlayer silicon becomes larger than that of the silicon oxide film, and a secondary electron emission ratio is accordingly lowered. In the present embodiment, the incident energy of the electron beam upon the sample S1 and the thickness of the silicon oxide film OF1 are selected so that the electron beam extends through the silicon oxide film OF1 to reach the substrate W which is an underlayer.

When the sample S1 shown in FIG. 2 is inspected with the EB unit, the following advantages are obtained, and it is therefore possible to improve the inspection performance of the mask pattern.

1) Improvement of Inspection Sensitivity Due to Reduction of Charge Amount:

Since the bottom of the concave pattern HP1 corresponds to the exposed portion of the top surface of the silicon substrate W, and is brought into the electrically conductive state to the silicon substrate W, charge-up of the sample is prevented, and improvement of inspection sensitivity is realized.

2) S/N Enhancement and Enhancement of Inspection Sensitivity Due to Enhancement of Contrast Ratio:

The secondary electron emission ratio of the silicon oxide film ($SiO_2$) is comparatively high, and is about 1.6 to 2 times that of a silicon (Si) layer. In a case where the electron beam strikes, for example, at 1 keV, the secondary electron emission ratios of silicon (Si) and the silicon oxide film ($SiO_2$) are 0.6 and 1.02, respectively. Therefore, the irradiation with the electron beam can set the signal amount of the secondary electrons and the like emitted from the silicon oxide film OF1 to be larger than the signal amount of the secondary electrons and the like emitted from the concave pattern HP1 having its bottom made of silicon (Si). Therefore, when the silicon oxide film OF1 is sufficiently thin to such an extent that any charge-up is not generated, it is possible to obtain an image having a high contrast ratio between the concave pattern HP1 and the silicon oxide film OF1 forming the remaining convex pattern.

3) Satisfactory Transfer Property of Mask Pattern:

In the sample shown in FIG. 2, a combination of the silicon oxide film ($SiO_2$)/silicon (Si) constitutes the concave pattern (which are a pattern to be noted) and the remaining convex pattern, the sample can be prepared with an excellent transfer property as compared with another combination of materials.

Figure 5:
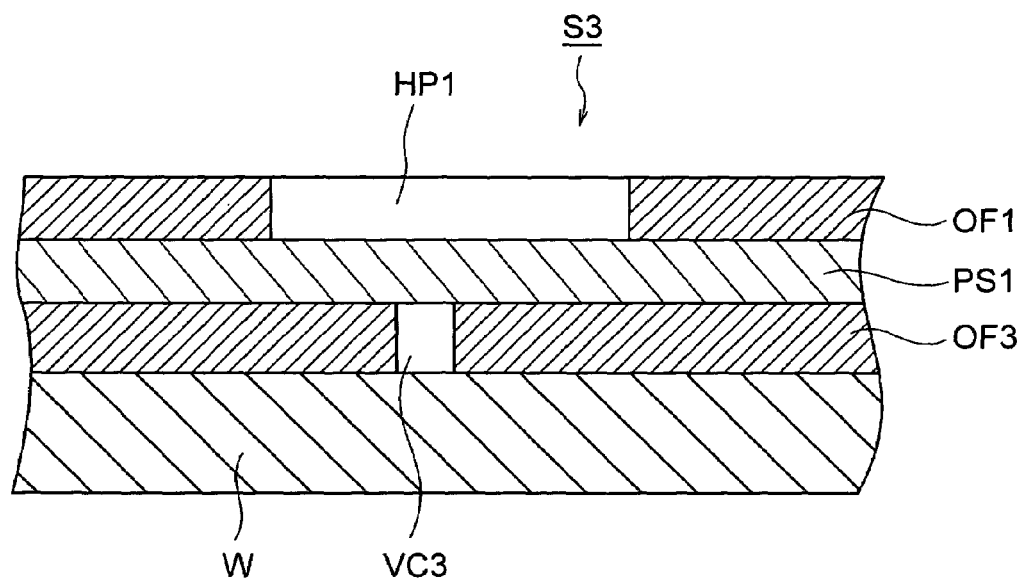
FIG. 5 is a sectional view showing a first modification of the sample shown in FIG. 2.

FIG. 5 is a sectional view showing a sample S3 as a first modification of the sample shown in FIG. 2. In the sample S3 of FIG. 5, a silicon oxide film OF3 is formed as a first insulating film on a semiconductor wafer W, a polysilicon layer PS1 is formed on this silicon oxide film OF3, and a silicon oxide film OF1 is formed as a second insulating film on this polysilicon layer PS1. The silicon oxide film OF1 is provided with a concave pattern HP1 having a shape in accordance with a mask pattern. In this modification, the concave pattern HP1 corresponds to, for example, a substrate surface pattern. In the silicon oxide film OF3, a via VC3 is made of polysilicon, thereby the polysilicon layer PS1 is electrically connected to the semiconductor wafer W. Even in this first modification S3, since the concave pattern HP1 is electrically connected to the semiconductor wafer W via the polysilicon layer PS1 and the via hole VC3, the modification produces a function and an effect similar to those of the sample S1 in the mask pattern inspection using the EB inspection unit and/or the exposure condition verification.

Figure 6:
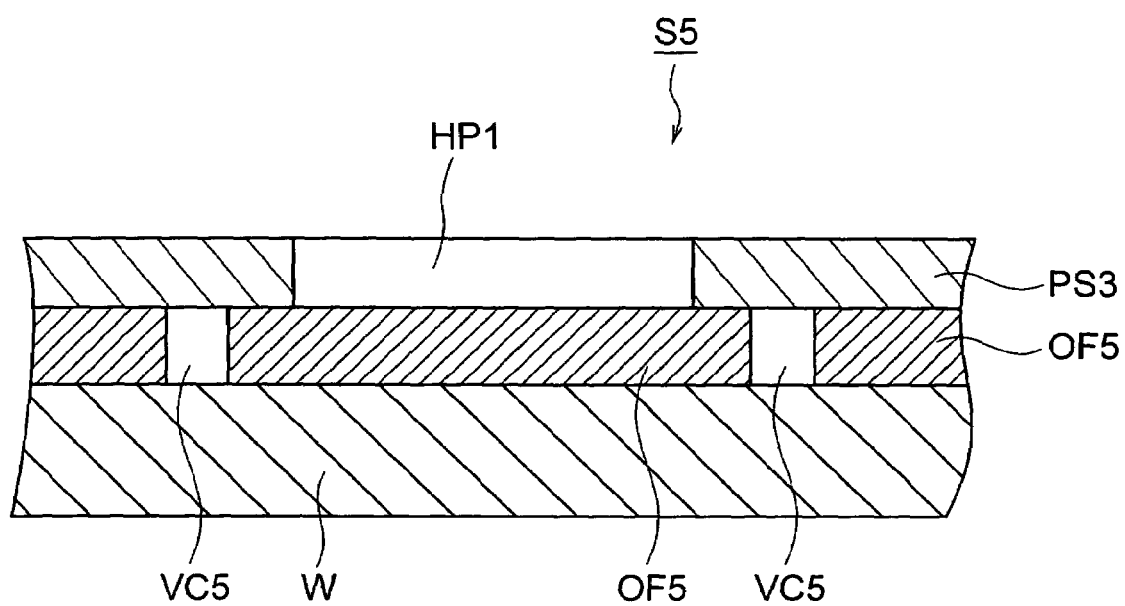
FIG. 6 is a sectional view showing a second modification of the sample shown in FIG. 2.

FIG. 6 is a sectional view showing a sample S5 as a second modification of the sample shown in FIG. 2. In the sample S5 of FIG. 6, a silicon oxide film OF5 is formed as an insulating film on a semiconductor wafer W, and a polysilicon layer PS3 is formed on this silicon oxide film OF5. The polysilicon layer PS3 is provided with a concave pattern HP1 having a shape in accordance with a mask pattern. In the silicon oxide film OF5 forming an underlayer of a remaining convex pattern other than the concave pattern HP1 in the polysilicon layer PS3, a via VC5 is made of polysilicon, thereby the polysilicon layer PS3 is electrically connected to the semiconductor substrate W.

In the present modification, the bottom of the concave pattern HP1 corresponds to the top of the silicon oxide film OF5, and the concave pattern HP1 itself is not connected to the semiconductor wafer W, but a remaining convex pattern portion of the polysilicon layer PS3 is connected to the semiconductor wafer W by the via VC5. Therefore, the sample S5 is prevented from being charged. In the present modification, the remaining convex pattern portion of the polysilicon layer PS3 corresponds to, for example, the substrate surface pattern. Since the silicon oxide film OF5 constitutes the underlayer of the concave pattern HP1, the irradiation with the secondary electron beam provides an image in which a region corresponding to the concave pattern HP1 is bright and a region corresponding to the remaining convex pattern portion is dark on conditions that the secondary electron beam penetrates the silicon oxide film OF5. An effect at a time when the sample S5 shown in FIG. 6 is used in the mask pattern inspection and the exposure condition verification is substantially the same as that of the above sample S1 of FIG. 2.

(2) SECOND EMBODIMENT

A second embodiment of the present invention will be described with reference to FIGS. 7 to 11.

Figure 7:
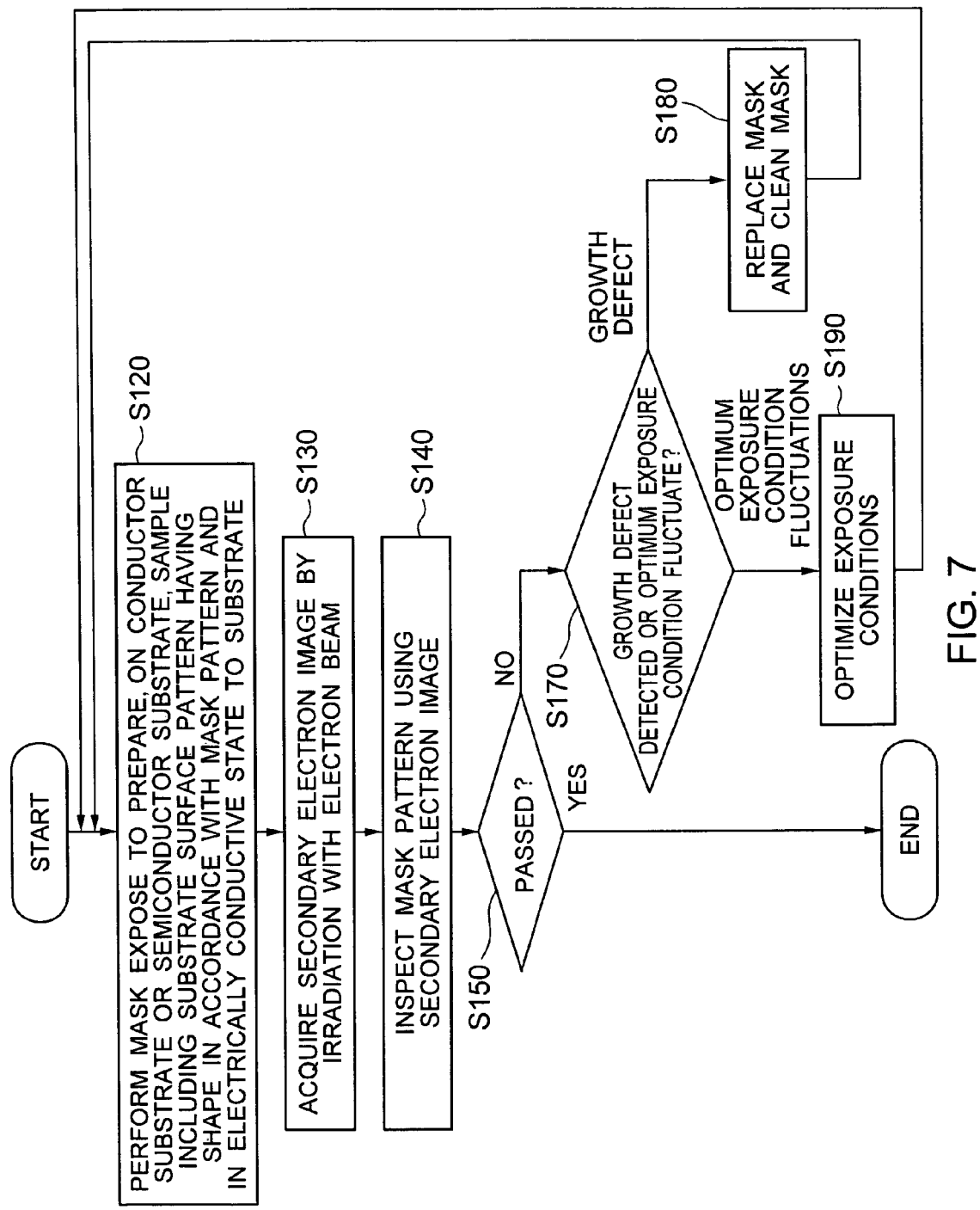
FIG. 7 is flowchart showing a schematic procedure of a second embodiment of the present invention.

FIG. 7 is a flowchart showing a schematic procedure of the present embodiment. The present embodiment enables an in-line monitor of a growth defect in a mask already prepared and used, and of stabilities of optimum exposure conditions. The growth defect is generated by repeatedly performing exposure and irradiation to the mask to produce a contaminant (mainly $(NH_4)_2SO_4$) on the mask. In a case where the optimum exposure conditions are in-line monitored, it is possible to correct and optimize, without delay, exposure conditions which have deviated from set exposure conditions for a certain cause such as an exposure apparatus. It is to be noted that even in the present embodiment, a procedure shown in step S120 is one of characteristic procedures, and there will be described later in detail a specific structure of a sample and a manufacturing method of the sample.

First, mask exposure is performed to transfer a mask pattern onto a conductor substrate or a semiconductor substrate, whereby there is prepared a sample including a substrate surface pattern having a shape in accordance with the mask pattern (step S120).

Next, the prepared sample is set to an electron beam (EB) unit, and irradiated with an electron beam, and secondary electrons and the like generated from the sample are detected to acquire an image indicating a state of the surface of the sample (step S130). In a case where the EB unit is of a electron optics (inspection) system (using EB projection optics), the secondary electrons and the like are enlarged and projected, formed as a secondary electron beam into an image on a detection surface of detector such as a micro channel plate (MCP) (not shown), and detected.

Subsequently, the mask pattern is inspected using the resultant image (step S140). In a case where an inspection result does not satisfy, for example, required specifications of a product, and the sample therefore fails in the inspection (step S150), a factor for the failure is analyzed, and it is judged whether the growth defect has been detected or the optimum exposure conditions have deviated from the exposure conditions set beforehand for a certain cause (step S170). In a case where it is judged that the growth defect of the mask is the cause for the failure, the mask is once replaced with a mask to be inspected next, the new mask is subjected to the above-described inspection, and the removed mask is cleaned during the inspection (step S180). When the cleaning of the mask ends, the inspected mask is replaced with the cleaned mask to repeat the above-described procedures again (steps S180 to S170).

In a case where the failure of the mask is caused by fluctuations of the optimum exposure conditions (step S170), the exposure conditions are adapted (step S190). Moreover, the above procedures are repeated until the mask passes the inspection (steps S120 to S170), thus the exposure conditions are optimized.

Figure 8:
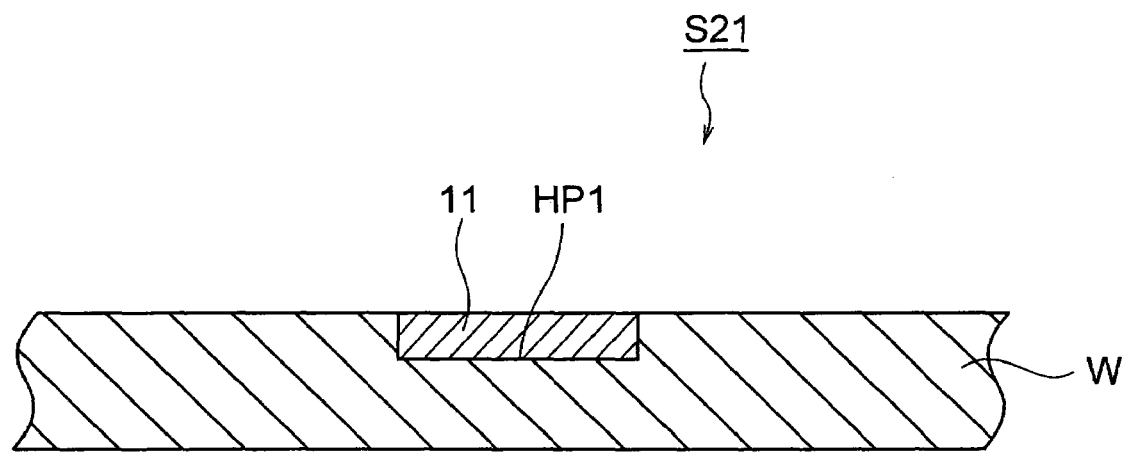
FIG. 8 is a sectional view showing one example of a sample for use in the second embodiment of the present invention.

FIG. 8 is a sectional view showing one example of a sample for use in the present embodiment. In a sample S21 shown in FIG. 8, a concave pattern HP1 is formed in a surface portion of a semiconductor substrate W in accordance with a mask pattern, and this concave pattern HP1 is filled with a silicon oxide film to form a tetra ethoxy silage (TEOS) film 11 which is an insulating film. In the present embodiment, a substrate surface layer portion other than the TEOS film 11 which fills in the concave pattern HP1 forms a part of the semiconductor wafer W, and a semiconductor wafer W surface layer other than the TEOS film 11 corresponds to, for example, a substrate surface pattern.

A manufacturing method of the sample S21 shown in FIG. 8 will be described with reference to sectional views of FIGS. 9A to 9G.

Figure 9A:
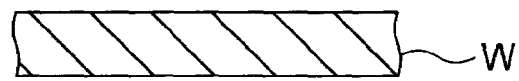
FIGS. 9A to 9G are sectional views showing a manufacturing method of the sample shown in FIG. 8.
Figure 9B:
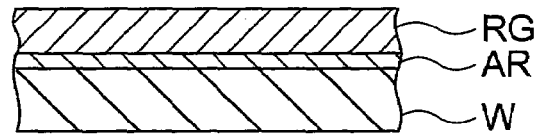

First, on the silicon wafer W shown in FIG. 9A, an anti-reflection coating AR is formed, and further a resist material is applied onto the top of the anti-reflection coating AR to form a resist film RG (FIG. 9B).

Figure 9C:
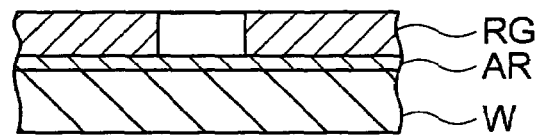

Subsequently, a mask pattern of a photo mask is formed on the resist film RG by exposure using an exposure apparatus (not shown) (FIG. 9C).

Figure 9D:
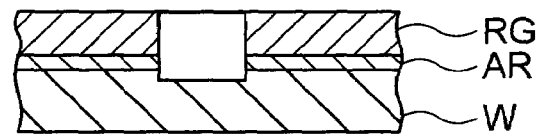

Next, for example, by RIE, a portion positioned under a portion of the resist film RG removed in accordance with the mask pattern is selectively removed from the anti-reflection coating AR and the silicon oxide film OF which form an underlayer of the resist film RG, whereby the mask pattern is transferred onto the surface of the silicon wafer W (FIG. 9D).

Figure 9E:
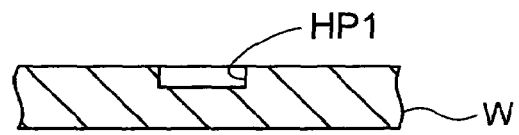

Next, for example, plasma ashing is performed to remove remaining portions of the anti-reflection coating AR and the resist film RG from the silicon wafer W, and there is formed the concave pattern HP1 having the shape in accordance with the mask pattern (FIG. 9E).

Figure 9F:
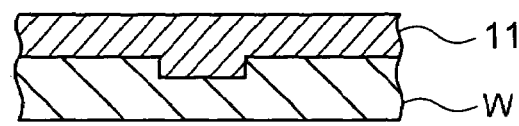
Figure 9G:
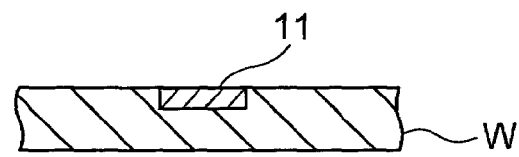

Furthermore, for example, by low pressure chemical vapor deposition (LPCVD), a TEOS film is formed so as to fill in the concave pattern HP1 (FIG. 9F).

Finally, by chemical mechanical polishing (CMP), the silicon wafer W is polished until an only portion of the TEOS film 11 filling in the concave pattern HP1 exclusively remains and is exposed (FIG. 9G), whereby the sample S21 shown in FIG. 8 is prepared.

In a case where the sample S21 shown in FIG. 8 is irradiated with an electron beam, since the amount of secondary electrons and the like emitted from the TEOS film 11 is larger than that of secondary electrons and the like emitted from the wafer W surface layer other than the concave pattern HP1, an image is obtained in which a concave pattern HP1 portion is bright and a pattern portion other than the concave pattern HP1 is dark.

Even in the present embodiment, it is preferable that the concave pattern HP1 has a small depth, that is, the thickness of the TEOS film 11 is small, but in the same manner as in the first embodiment, incident energy of the electron beam upon the sample S21 and the thickness of the TEOS film 11 are selected so that the electron beam penetrates the TEOS film 11 to reach the substrate W which is an underlayer.

In the present embodiment, since the surface of the wafer W is flattened by a CMP process to form the TEOS film 11, uniformity of a surface potential of the wafer W is further improved. This brings about a remarkable effect that an inspection performance is further improved in a case of an electron optics inspection using EB projection optics is used.

Figure 10:
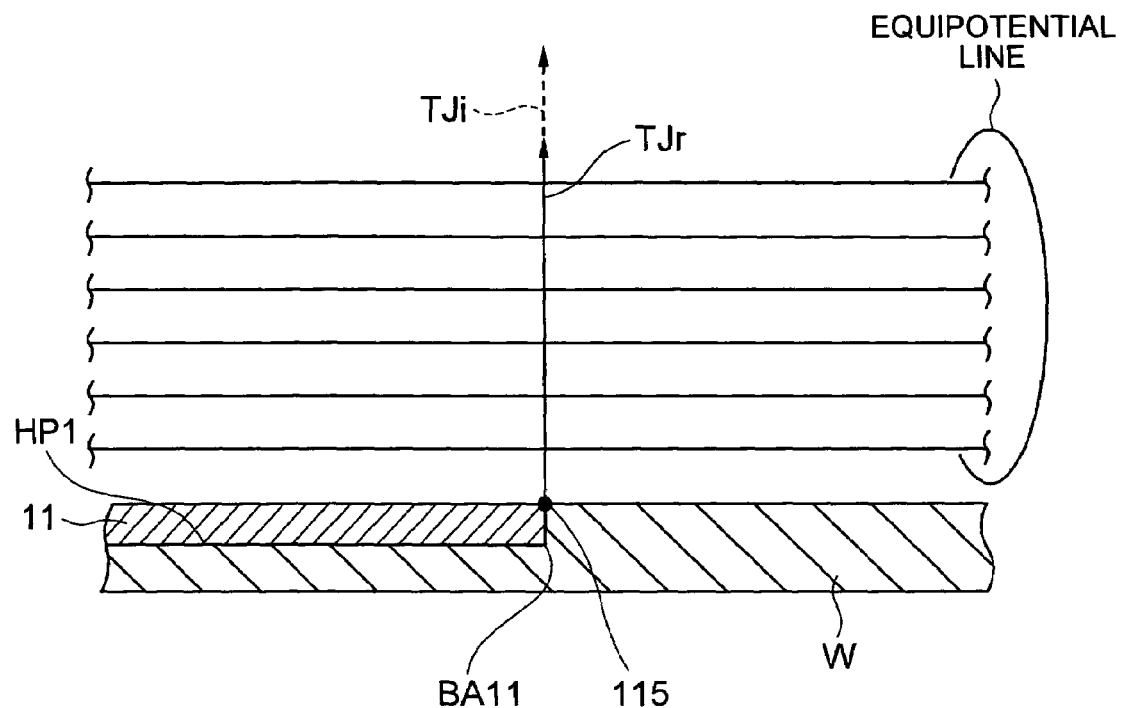
FIG. 10 is an explanatory view showing an advantage in inspection or verification in a case where there is not any stepped portion on the surface of the sample.

This point will be described more specifically with reference to FIG. 10. A concave pattern HP1 formed in a surface layer of a silicon wafer W is filled with a TEOS film 11, and the surface of the sample S21 is flattened by the CMP process. Therefore, when the irradiation with the electron beam sets the whole substrate surface to a substantially equal potential, any potential gradient is not generated in the vicinity of a boundary portion BA11 of the TEOS film 11. As a result, for example, a trajectory TJr of the secondary electron beam emitted from an arbitrary point 115 on the boundary portion BA11 agrees with an ideal trajectory TJi. This eliminates possibilities of image distortion in the boundary portion and signal amount decrease which have raised a problem in acquiring an image with electron optics inspection system using EB projection optics, in a case where there is a stepped portion on the surface.

Figure 11:
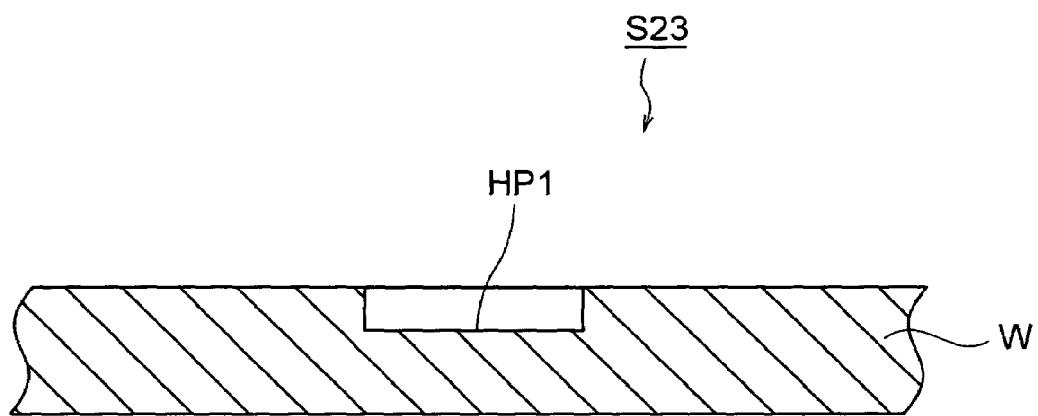
FIG. 11 is a sectional view showing one modification of the sample shown in FIG. 8.

FIG. 11 is a sectional view showing one modification of the sample S21 shown in FIG. 8. As apparent from comparison with FIG. 8, one of the characteristics of a sample S23 shown in FIG. 11 lies in that a concave pattern HP1 formed in the surface of a silicon wafer W in accordance with a mask pattern is not filled with a certain material, and the bottom of the pattern is exposed as such. Even such structure can be used in inspection of the mask pattern and verification of exposure conditions unless inspection sensitivity is influenced, for example, in a case where the concave pattern HP1 is formed to be shallow. Especially, since the sample S23 of FIG. 11 can be prepared only by the processes shown in FIGS. 9A to 9E, there is an advantage that the sample can be manufactured more easily than the sample S21 of FIG. 8.

(3) Manufacturing Method of Semiconductor Device

When at least one of the above mask pattern inspection method and the exposure condition verification method is used in a process of inspecting a semiconductor device, it is possible to manufacture the semiconductor device with a high yield.

Embodiments of the present invention have been described above, but the present invention is not limited to the above embodiments, and can, needless to say, be modified and implemented variously within the scope thereof.

For example, in the first embodiment, the concave pattern HP1 has been defined and described as the substrate surface pattern. From a viewpoint that a bright portion of the image be provided, however, there would be raised no problems even if the convex pattern of the remaining portion is defined as the substrate surface pattern. In other words, the substrate surface pattern may be defined as the convex pattern or the concave pattern in accordance with inspection purposes. This also applies to another embodiment.

Moreover, in the second embodiment, there has been described an only case where the concave pattern HP1 is disposed in the surface of the semiconductor wafer W, but the present invention is not limited to this embodiment. For example, as shown in the modifications of FIGS. 5 and 6, another insulating film or silicon layer may be disposed between the semiconductor substrate W and the concave pattern HP1 in accordance with a layer in which the mask is to be used.

Furthermore, in the above embodiments, the mask inspection and exposure condition verification at a time when the new mask is prepared have been described above using the sample which is separate from the sample used in describing above the in-line mask growth defect inspection and exposure condition stability monitoring. However, any person skilled in the art easily understands that either sample can be used in any inspection and exposure condition verification in accordance with the shape of the mask pattern and a process for use.

In addition, in the above second embodiment, subsequently to the detection of the growth defect of the mask, the procedure shifts to the optimization of the exposure conditions, but the present invention is not limited to this embodiment. The detection of the growth defect of the mask may be executed in parallel with the optimization of the exposure conditions.

What is claimed is:

1. A mask pattern inspection method comprising:
    transferring a mask pattern onto a conductor substrate or a semiconductor substrate;
    preparing a sample comprising a substrate surface pattern in an electrically conductive state to the substrate, and in a shape in accordance with the transferred mask pattern;
    irradiating the sample with an electron beam to detect at least one of a secondary electron, a reflected electron and a backscattered electron generated from the surface of the sample, thereby acquiring an image of the sample surface; and
    inspecting the mask pattern on the basis of the image,
    wherein the substrate surface pattern comprises one of a first pattern formed by selectively removing an insulating layer above the substrate, a second pattern formed by selectively removing a conductive layer on an insulating layer above the substrate, and a third pattern formed by filling a pattern formed by selectively removing a surface layer of the substrate, with an insulating material, and
    incident energy of the electron beam onto the sample and a thickness of the insulating layer or of the third pattern are selected in a manner that the electron beam penetrates the insulating layer or the insulating material to reach a layer beneath the insulating layer or the third pattern.

2. The mask pattern inspection method according to claim 1, further comprising:
    correcting a defect, when the defect is a correctable slight defect, or re-preparing a mask, when the defect is a non-correctable serious defect, in a case where the mask pattern fails because the defect exists in the mask pattern; and
    repeating the transferring to the correcting or the re-preparing by use of the corrected or re-prepared mask until the mask pattern passes the inspection.

3. The mask pattern inspection method according to claim 1,
    wherein the substrate surface pattern further comprises a conductive layer in the electrically conductive state to the substrate and formed between the substrate and the first pattern, and
    the thickness of the insulating layer and incident energy of the electron beam onto the sample are selected in a manner that the electron beam penetrates the insulating layer to reach the conductive layer.

4. The mask pattern inspection method according to claim 1,
    wherein the surface of the substrate has a stepped portion, and
    the thickness of the insulating layer is selected so that a potential gradient generated in the vicinity of a boundary of the stepped portion becomes gradual.

5. An exposure condition verification method comprising:
    transferring a mask pattern onto a conductor substrate or a semiconductor substrate;
    preparing a sample comprises a substrate surface pattern in an electrically conductive state to the substrate, and in a shape in accordance with the transferred mask pattern;
    irradiating the sample with an electron beam to detect at least one of a secondary electron, a reflected electron and a backscattered electron generated from the surface of the sample, thereby acquiring an image of the sample surface;
    inspecting the mask pattern based on the image; and
    verifying whether or not preset exposure conditions are appropriate concerning the mask pattern which has passed the inspection on the basis of the inspection result of the mask pattern,
    wherein the substrate surface pattern comprises one of a first pattern formed by selectively removing an insulating layer above the substrate, a second pattern formed by selectively removing a conductive layer on an insulating layer above the substrate, and a third pattern formed by filling a pattern formed by selectively removing a surface layer of the substrate, with an insulating material, and incident energy of the electron beam onto the sample and a thickness of the insulating layer or of the third pattern are selected in a manner that the electron beam penetrates the insulating layer or the insulating material to reach a layer beneath the insulating layer or the third pattern.

6. The exposure condition verification method according to claim 5, further comprising:

correcting the mask, when the correction of the mask is effective, or re-preparing the mask, when the exposure conditions are inappropriate to such an extent that the correction of the mask is not effective, in a case where it is judged that the exposure conditions are inappropriate; and repeating the transferring to the correcting or the re-preparing by use of the corrected or re-prepared mask until the appropriate exposure conditions are obtained.

7. The exposure condition verification method according to claim 5, wherein the substrate surface pattern further comprises a conductive layer in the electrically conductive state to the substrate and formed between the substrate and the first pattern, and the thickness of the insulating layer and the incident energy of the electron beam onto the sample are selected in a manner that the electron beam penetrates the insulating layer to reach or the conductive layer.

8. The exposure condition verification method according to claim 5, wherein the thickness of the insulating layer is selected so that a potential gradient generated in the vicinity of a boundary of the stepped portion becomes gradual.

9. A manufacturing method of a semiconductor device, comprising transferring a mask pattern inspected by a mask pattern inspection method onto a substrate to thereby manufacture the semiconductor device, the mask pattern inspection method comprising:

transferring a mask pattern onto a conductor substrate or a semiconductor substrate;

preparing a sample comprising a substrate surface pattern in an electrically conductive state to the substrate, and in a shape in accordance with the transferred mask pattern;

irradiating the sample with an electron beam to detect at least one of a secondary electron, a reflected electron and a backscattered electron generated from the surface of the sample, thereby acquiring an image of the sample surface; and inspecting the mask pattern on the basis of the image, wherein the substrate surface pattern comprises one of a first pattern formed by selectively removing an insulating layer above the substrate, a second pattern formed by selectively removing a conductive layer on an insulating layer above the substrate, and a third pattern formed by filling a pattern formed by selectively removing a surface layer of the substrate, with an insulating material, and incident energy of the electron beam onto the sample and a thickness of the insulating layer or of the third pattern are selected in a manner that the electron beam penetrates the insulating layer or the insulating material to reach a layer beneath the insulating layer or the third pattern.

10. The manufacturing method of a semiconductor device according to claim 9, the mask pattern inspection method further comprising:

correcting a defect, when the defect is a correctable slight defect, or re-preparing a mask, when the defect is a non-correctable serious defect, in a case where the mask pattern fails because the defect exists in the mask pattern; and repeating the transferring to the correcting or the re-preparing by use of the corrected or re-prepared mask until the mask pattern passes the inspection.

11. A manufacturing method of a semiconductor device, comprising transferring a mask pattern onto a substrate using an exposure condition to thereby manufacture the semiconductor device, the exposure condition being verified by an exposure condition verification method comprising:

transferring a mask pattern onto a conductor substrate or a semiconductor substrate;

preparing a sample comprising a substrate surface pattern in an electrically conductive state to the substrate, and in a shape in accordance with the transferred mask pattern;

irradiating the sample with an electron beam to detect at least one of a secondary electron, a reflected electron and a backscattered electron generated from the surface of the sample, thereby acquiring an image of the sample surface;

inspecting the mask pattern based on the image; and verifying whether or not preset exposure conditions are appropriate concerning the mask pattern which has passed the inspection on the basis of the inspection result of the mask pattern, wherein the substrate surface pattern comprises one of a first pattern formed by selectively removing an insulating layer above the substrate, a second pattern formed by selectively removing a conductive layer on an insulating layer above the substrate, and a third pattern formed by filling a pattern formed by selectively removing a surface layer of the substrate, with an insulating material, and incident energy of the electron beam onto the sample and a thickness of the insulating layer or of the third pattern are selected in a manner that the electron beam penetrates the insulating layer or the insulating material to reach a layer beneath the insulating layer or the third pattern.

12. The manufacturing method of a semiconductor device according to claim 11, wherein the exposure condition verification method further comprises:

correcting the mask, when the correction of the mask is effective, or re-preparing the mask, when the exposure conditions are inappropriate to such an extent that the correction of the mask is not effective, in a case where it is judged that the exposure conditions are inappropriate; and repeating the transferring to the correcting or the re-preparing by use of the corrected or re-prepared mask until the appropriate exposure conditions are obtained.

* * * * *